United States Patent
Li et al.

(10) Patent No.: US 11,437,411 B2
(45) Date of Patent: Sep. 6, 2022

(54) THIN FILM TRANSISTOR DRIVE BACKPLANE AND MICRO-LIGHT EMITTING DIODE DISPLAY

(71) Applicant: SHENZHEN CHINA STAR OPTOELECTRONICS SEMICONDUCTOR DISPLAY TECHNOLOGY CO., LTD., Shenzhen (CN)

(72) Inventors: Gongtan Li, Shenzhen (CN); Hyunsik Seo, Shenzhen (CN)

( * ) Notice: Subject to any disclaimer, the term of this patent is extended or adjusted under 35 U.S.C. 154(b) by 217 days.

(21) Appl. No.: 16/616,982

(22) PCT Filed: Aug. 22, 2019

(86) PCT No.: PCT/CN2019/101987
§ 371 (c)(1),
(2) Date: Nov. 26, 2019

(87) PCT Pub. No.: WO2021/012344
PCT Pub. Date: Jan. 28, 2021

(65) Prior Publication Data
US 2021/0126016 A1    Apr. 29, 2021

(30) Foreign Application Priority Data

Jul. 24, 2019  (CN) .......................... 201910671388.0

(51) Int. Cl.
*H01L 27/12* (2006.01)
*H01L 25/16* (2006.01)

(52) U.S. Cl.
CPC .......... *H01L 27/124* (2013.01); *H01L 25/167* (2013.01); *H01L 27/1225* (2013.01)

(58) Field of Classification Search
CPC ........... H01L 29/78633; H01L 29/7869; H01L 27/3272; H01L 27/1225; H01L 27/124;
(Continued)

(56) References Cited

U.S. PATENT DOCUMENTS 10,276,476 B1 * 4/2019 Li ........................ H01L 21/8258
2003/0168992 A1 * 9/2003 Noguchi ............. H01L 27/3276
315/169.3

(Continued)

FOREIGN PATENT DOCUMENTS

CN       106898710 A  *  6/2017  ......... H01L 27/3272
CN       107564949 A      1/2018

(Continued)

OTHER PUBLICATIONS

I. Noviyana et al., "High Mobility Thin Film Transistors Based on Amorphous Indium Zinc Tin Oxide," Materials 2017, 10, 702; doi: 10.3390/ma10070702. Published Jun. 26, 2017. (Year: 2017).*

*Primary Examiner* — Peter M Albrecht

(57) ABSTRACT

The present invention discloses a thin film transistor (TFT) drive backplane and a Micro- light emitting diode (LED) display that by employing a structure of an oxide thin film transistor drive backplane with a high mobility can achieve fulfillment of the need for large size Micro-LED displays. Disposing the rear metal layer under the base substrate with the rear metal layer including a metal wire layer configured to connect with a drive chip and a metal light shielding layer configured to block ambient light reduces a spliced bezel of the display panel in application of large size Micro-LED displays, reduces depositing and patterning steps of the metal light shielding layer during manufacturing the thin film transistors and further reduces process steps of manufacturing a TFT drive backplane.

7 Claims, 3 Drawing Sheets

(58) Field of Classification Search
CPC ........... H01L 27/3276; H01L 29/78693; H01L 27/3279
See application file for complete search history.

(56) References Cited

U.S. PATENT DOCUMENTS

| | | | | |
|---|---|---|---|---|
| 2007/0040798 A1* | 2/2007 | Kawai | .................... | G02F 1/167 |
| | | | | 345/107 |
| 2007/0090365 A1* | 4/2007 | Hayashi | .............. | H01L 27/1225 |
| | | | | 257/72 |
| 2007/0252147 A1* | 11/2007 | Kim | .................... | H01L 29/7869 |
| | | | | 257/59 |
| 2010/0072554 A1 | 3/2010 | Goto et al. | | |
| 2017/0179159 A1* | 6/2017 | Kawata | ............... | G02F 1/13452 |
| 2018/0182832 A1* | 6/2018 | Lee | .................... | H01L 27/1225 |

FOREIGN PATENT DOCUMENTS

| | | | | |
|---|---|---|---|---|
| CN | 109244107 A | 1/2019 | | |
| CN | 109768027 A | 5/2019 | | |
| KR | 20160038494 A * | 4/2016 | ......... | H01L 27/3276 |

\* cited by examiner

THIN FILM TRANSISTOR DRIVE BACKPLANE AND MICRO-LIGHT EMITTING DIODE DISPLAY

FIELD OF INVENTION

The present invention relates to a field of display technologies, especially to a thin film transistor (TFT) drive backplane for a Micro-light emitting diode (LED) display and a Micro-LED display.

BACKGROUND OF INVENTION

A Micro-light emitting diode (LED) technology, i.e., an LED miniaturization and arraying technology, means to integrate an LED array with a high density and a tiny size on a chip, for example, an LED display screen includes each of pixels that can be addressed individually and be driven to illuminate separately such that a distance between the pixels is lowered down to a micron scale. An application of importance of the Micro-LED is super large size displays.

At present, a drive backplane used for Micro-LED is a top gate low temperature polycrystalline silicon thin film transistor (Top Gate LTPS TFT). At present, the low temperature polycrystalline silicon (LTPS) thin film transistor can only be produced in a 6th generation production line (a size of a glass substrate is 1.5 m×1.85 m). A dimension of glass of a motherboard is comparatively small such that a production capacity of application of super large size products easily encounters a bottleneck. The oxide thin film transistor technology can produce products in a big generation production line (11th generation production line, 3.37 m×2.94 m). Therefore, the oxide thin film transistor technology prevails in application of large size Micro-LED displays.

However, the Micro-LED display highly demands a mobility of a thin film transistor in a drive backplane, and requires a field effect mobility being greater than 30 $cm^2/Vs$. At present, a mobility of an oxide thin film transistor substantially made of indium gallium zinc oxide (IGZO) is generally 10 $cm^2/Vs$, which cannot satisfy the requirement for the Micro-LED display.

Furthermore, in the application of large size Micro-LED displays, splicing technologies are used often. A peripheral region of a regular display panel is the region for connection of wires and drive chips, and is usually 3-50 mm wide. Therefore, black lines are formed on the bezel when displays are spliced, which influences the displaying effect.

Therefore, the issue of the conventional oxide semiconductor material having a mobility too low to satisfy a display requirement of Micro-LED displays and the issue how to reduce the bezel when splicing is implemented and how to reduce processes of manufacturing a thin film transistor drive backplane, become a problem for development of the Micro-LED display application technology that need to be solved urgently.

SUMMARY OF INVENTION

An objective of the present invention is to aim at the existing issue of the prior art and provide a thin film transistor (TFT) drive backplane and a Micro-light emitting diode (LED) display that can fulfill the need for large size Micro-LED displays, can solve the issue that a conventional oxide semiconductor material has a mobility and barely satisfies the need of Micro-LED displays, and can reduce a spliced bezel and further reduce process steps of manufacturing a thin film transistor drive backplane.

To achieve the above objective, the present invention provides a TFT drive backplane, the TFT drive backplane comprises a base substrate; an active layer is disposed on the base substrate, and the active layer employs an oxide semiconductor material with a mobility being greater than or equal to 30 $cm^2/Vs$ and is made by a magnetron sputtering process; and a rear metal layer is disposed under the base substrate, the rear metal layer comprises a metal light shielding layer and a metal wire layer configured to connect with a drive chip, the metal light shielding layer is disposed opposite to the active layer, and a length of the metal light shielding layer is greater than a length of a channel region of the active layer, a width of the metal light shielding layer is greater than a width of the channel region of the active layer, and a center of the channel region of the active layer is aligned with a center of the metal light shielding layer.

To achieve the above objective, the present invention also provides a TFT drive backplane. The TFT drive backplane comprises a base substrate; an active layer is disposed on the base substrate, and the active layer is made of an oxide semiconductor material with a mobility being greater than or equal to 30 $cm^2/Vs$, and a rear metal layer is disposed under the base substrate, and the rear metal layer comprises a metal light shielding layer and a metal wire layer configured to connect with a drive chip, and the metal light shielding layer is disposed opposite to the active layer.

To achieve the above objective, the present invention further provides a Micro-LED display. The Micro-LED display comprises a thin film transistor (TFT) drive backplane, the TFT drive backplane comprises a base substrate; an active layer is disposed on the base substrate, and the active layer employs an oxide semiconductor material with a mobility being greater than or equal to 30 $cm^2/Vs$ and is made by a magnetron sputtering process; and a rear metal layer is disposed under the base substrate, the rear metal layer comprises a metal light shielding layer and a metal wire layer configured to connect with a drive chip, the metal light shielding layer is disposed opposite to the active layer.

Advantages of the present invention are as follows. The present invention, by employing a structure of an oxide thin film transistor drive backplane with a high mobility, can fulfill the need for large size Micro-LED displays. Disposing the rear metal layer under the base substrate with the rear metal layer including a metal wire layer configured to connect with a drive chip and a metal light shielding layer configured to block ambient light reduces a spliced bezel of the display panel in application of large size Micro-LED displays, omits depositing and patterning steps of the original metal light shielding layer during manufacturing the thin film transistors and further process steps of manufacturing a TFT drive backplane and lower the manufacturing cost.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
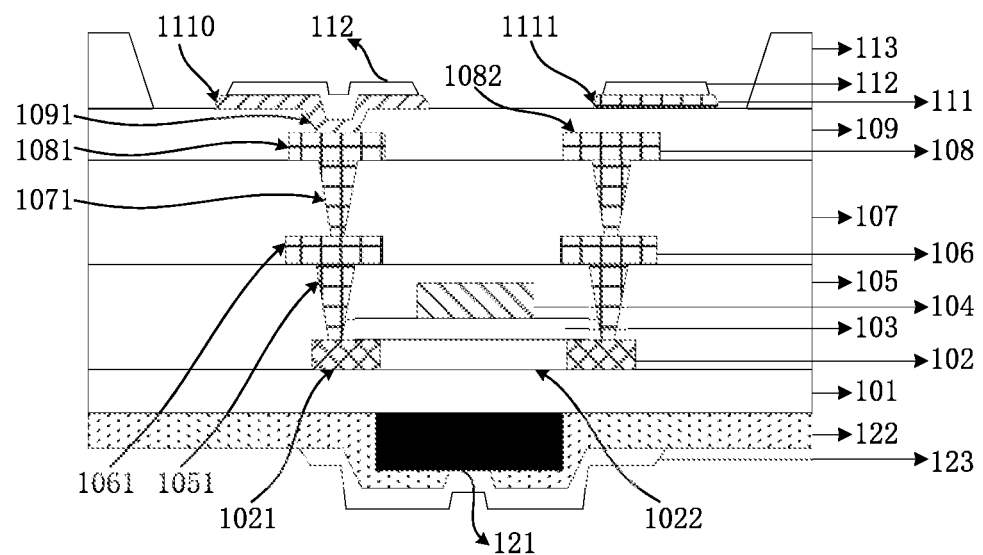
FIG. 1 is a schematic view of laminated structures of a first embodiment of a TFT drive backplane of the present invention.

Embodiments of the present invention will be described in details. Examples of the embodiments are illustrated in the accompanying drawings. The same or similar reference characters refer to the same or similar elements or elements including the same or similar functions. The following embodiments described with reference to the accompanying drawings are exemplary, are only configured to construe the present invention and cannot be understood as limitations to the present invention.

In the present invention, it should be noted that unless clear rules and limitations otherwise exist, words "a first feature is "on" or "under" a second feature" can include a direct contact of the first and second features, can also include a contact of the first and second features through another feature therebetween instead of a direct contact. Furthermore, words "the first feature is "above" or "over" the second feature include that the first feature is right above or obliquely above the second feature, or only indicate that a level of the first feature is higher than that of the second feature. Words "the first feature is "under" or "below" the second feature include that the first feature is right under or obliquely under the second feature, or only indicate that the level of the first feature is lower than that of the second feature.

The following disclosure provides many different embodiments or examples to achieve different structures of the present invention. To simplify the disclosure of the present invention, the components and arrangements of the specific examples are described below. Of course, they are merely examples, and the purpose is not to limit the present invention. Furthermore, the present invention may repeat reference numerals and/or reference letters in different examples. The repetition is for the purpose of simplification and clarity, and does not by itself indicate the relationship between the various embodiments and/or settings discussed. In addition, the present invention provides examples of various specific processes and materials, but a person of ordinary skill in the art can be aware of the application of other processes and/or the use of other materials.

The present invention provides a new thin film transistor (TFT) drive backplane adapted for application in large size Micro-light emitting diode (LED) displays. The TFT drive backplane comprises a base substrate; an active layer is disposed on the base substrate, and the active layer is made of an oxide semiconductor material with a mobility being greater than or equal to 30 cm$^2$/Vs, a rear metal layer is disposed under the base substrate, and the rear metal layer comprises a metal light shielding layer, and the metal light shielding layer is disposed opposite to the active layer.

Employing a TFT drive backplane of the present invention can achieve a structure of an oxide thin film transistor drive backplane with a high mobility for fulfilling the need for large size Micro-LED displays, and can solve the issue that a conventional oxide semiconductor material has a low mobility and barely satisfies the need for Micro-LED displays. At the meantime, a metal light shielding layer with a light shielding characteristic is disposed on a rear of the drive backplane opposite to an active layer region of the thin film transistor for blocking ambient light. The metal light shielding layer can have the same function of the metal light shielding layer of the conventional thin film transistor. Therefore, the thin film transistor in the drive backplane of the present invention no longer needs a metal light shielding layer. Therefore, the present invention can omit depositing and patterning steps of the original metal light shielding layer during manufacturing the thin film transistor to further reduce process steps of manufacturing a TFT drive backplane and lower the manufacturing cost.

Preferably, the rear metal layer further comprises a metal wire layer configured to connect with a drive chip such that the drive chip can be set on a rear of the drive backplane to make the display panel bezel compact. In other words, to reduce a spliced bezel of the display panel in application of large size Micro-LED displays, the TFT drive backplane of the present invention, by disposing the metal wire layer on a side and a rear, can dispose a drive chip on the rear of the drive backplane to further reduce a spliced bezel and lower the manufacturing cost.

Figure 2:
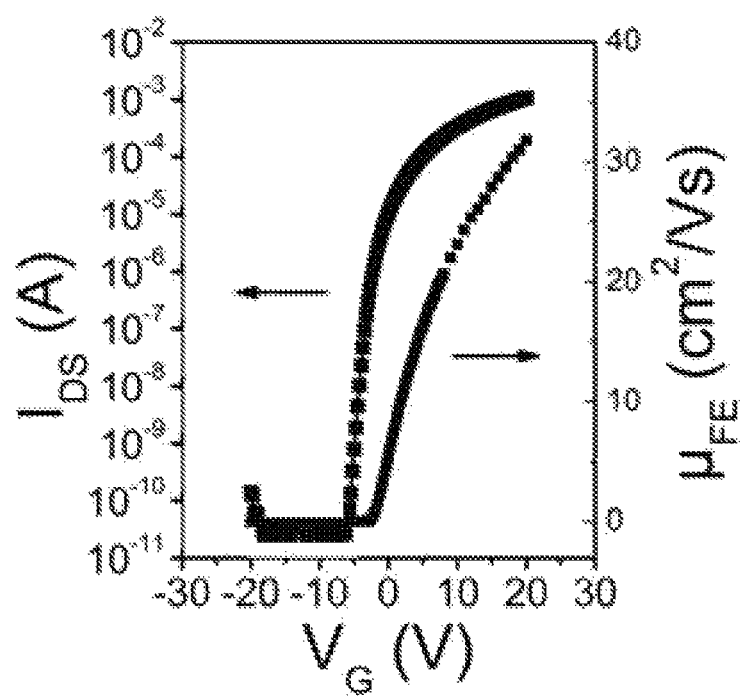
FIG. 2 is a schematic view of a curve chart of an oxide thin film transistor IV.

With reference to FIGS. 1 and 2, wherein FIG. 1 is a schematic view of laminated structures of a first embodiment of a TFT drive backplane of the present invention, FIG. 2 is a schematic view of a curve chart of an oxide thin film transistor IV.

With reference to FIG. 1, the TFT drive backplane of the present invention comprises: a base substrate 101, an active layer (Act) 102 disposed on the base substrate 101, a gate insulation layer (GI) 103 disposed on the active layer 102, a gate electrode (GE) 104 disposed on the gate insulation layer 103, a dielectric insulation layer (ILD) 105 disposed on the gate electrode 104 and covering the gate electrode 104, the gate insulation layer 103, the active layer 102, and the base substrate 101, a first source/drain electrode metal layer (S/D1) 106 disposed on the dielectric insulation layer 105, a first passivation layer (VIA1) 107 disposed on the first source/drain electrode metal layer 106 and covering the first source/drain electrode metal layer 106 and the dielectric insulation layer 105, a second source/drain electrode metal layer (S/D2) 108 disposed on the first passivation layer 107, a second passivation layer (VIA2) 109 disposed on the second source/drain electrode metal layer 108 and covering the second source/drain electrode metal layer 108, a third source/drain electrode metal layer (S/D3) 111 disposed on the second passivation layer 109, and a first transparent conductive layer (ITO1) 112 disposed on the third source/drain electrode metal layer 111. In the present embodiment, a third passivation layer (VIA3) 113 is disposed on the second passivation layer 109, by etching the third passivation layer 113, a manufacturing region of the third source/drain electrode metal layer 111 is exposed.

In the present embodiment, the active layer 102 comprises a channel region 1022 corresponding to the gate electrode 104 and a source/drain electrode contact region 1021 located on two sides of the channel region 1022. The first source/drain electrode metal layer 106 comprises a source/drain electrode 1061, a first through hole 1051 is defined between the source/drain electrode contact region 1021 and the source/drain electrode 1061, and the source/drain electrode 1061 contacts the source/drain electrode contact region 1021 through the first through hole 1051. The second source/drain electrode metal layer 108 comprises an electrode connection line 1081 and a first drive power line 1082. One of two second through holes 1071 is defined between the electrode connection line 1081 the source/drain electrode 1061 and the other second through hole 1071 is defined between the first drive power line 1082 and the source/drain electrode 1061.

The source/drain electrode 1061 is connected to the electrode connection line 1081 and the first drive power line 1082 through the second through holes 1071 respectively. The active layer 102, the gate electrode 1041, the source/drain electrode 1081 form a thin film transistor of the TFT drive backplane. The third source/drain electrode metal layer 111 comprises a anode 1110 and a second drive power line 1111 that are patterned. A third through hole 1091 is defined between the anode 1110 and the electrode connection line 1081, the anode 1110 is connected to the electrode connection line 1081 through the third through hole 1091. In the present embodiment, the first drive power line 1082 is configured to provide voltage drive signals (VDD), the second drive power line 1111 is configured to provide power switch signals (VSS). The first transparent conductive layer 112 serves as a pixel electrode.

In the present embodiment, the TFT drive backplane employs three source/drain electrode metal layers. It should be noted that both employing a single source/drain electrode metal layer or employing two or more source/drain electrode metal layers can uses the improved structure of the TFT drive backplane of the present invention, in other words, the active layer is manufactured by an oxide semiconductor material with a mobility being greater than or equal to 30 $cm^2/Vs$. A metal light shielding layer is disposed on a rear of the backplane opposite to the active layer.

Specifically, the base substrate 101 can be a glass substrate or a flexible substrate made of high molecular polymer, and the high molecular polymer can be polyimide (PI).

Specifically, the active layer 102 employs an oxide semiconductor material with a mobility being greater than or equal to 30 $cm^2/Vs$, and is manufactured by a magnetron sputtering process. The oxide semiconductor material can be an oxide semiconductor material including indium (In) and tin (Sn) and having a mobility being greater than or equal to 30 $cm^2/Vs$. Alternatively, the oxide semiconductor material can be an oxide semiconductor material including gallium (Ga) and tin (Sn) and having a mobility being greater than or equal to 30 $cm^2/Vs$. Alternatively, the oxide semiconductor material can be an oxide semiconductor material including indium (In), fluorine (F), and oxygen (O) and having a mobility being greater than or equal to 30 $cm^2/Vs$. With reference to FIG. 2, a horizontal coordinate indicates a voltage VG (unit: voltage (V)) of the gate electrode, and a vertical coordinate indicates a current IDS (unit: ampere (A)) of the source/drain electrode, in the chart two curves are used to respectively indicate two different mobilities μFE (unit: $cm^2/V·s$). the higher the mobility is, the faster the thin film transistor device operates and the higher a switching-off frequency is. Therefore, the present invention employs an active layer made of an oxide semiconductor material with a mobility being greater than or equal to 30 $cm^2/Vs$ such that the TFT drive backplane of the present invention can be adapted for application of Micro-LED displays and fulfill the need for large size Micro-LED displays.

Specifically, the first passivation layer (VIA1) 107, the second passivation layer (VIA2) 109, and the third passivation layer (VIA3) 113 can be made of the same material.

In the present embodiment, a rear metal layer is disposed under the base substrate 101, and the rear metal layer comprises: a metal light shielding layer 121 disposed opposite to the channel region 1022 of the active layer 102, a rear insulation layer 122 disposed under the metal light shielding layer 121 and covering the metal light shielding layer 121 and a rear of the base substrate 101, and a metal wire layer 123 disposed under the rear insulation layer 122. In other words, a metal light shielding structure is disposed on the rear while the metal wire layer is disposed on the rear simultaneously such that depositing and patterning steps of the original metal light shielding layer can be omitted during manufacturing the thin film transistor. The rear insulation layer 122 is etched to expose some of through hole of the metal light shielding layer 121, and the metal wire layer 123 contacts the metal light shielding layer 121 through the through holes.

Specifically, material of the metal light shielding layer 121 is metal including a light blocking function, for example, a composite layer including stacked IZO, CuCa, can also be other metal material including a light blocking function. Preferably, both a length and a width of the metal light shielding layer 121 are greater than a length and a width of the channel region 1022 of the active layer 102, and a center of the channel region 1022 of the active layer 102 is aligned with a center of the metal light shielding layer 121 to effectively block ambient light to shield light for protection of the active layer 102.

Specifically, the rear insulation layer 122 can be a silicon oxide (SiOx) layer, a silicon nitride (SiNx) layer, or a silicon oxynitride (SiOxNy) layer.

Specifically, metal wires of the metal wire layer 123 are configured to connect with the drive chip such that the drive chip can be set under the rear of the drive backplane to make the display panel bezel compact. Preferably, the metal wire layer 123 is made of transparent conductive material (Indium Tin Oxide, ITO).

The TFT drive backplane of the present invention employs a structure of an oxide thin film transistor drive backplane with a high mobility and can achieve satisfaction of the need for large size Micro-LED displays. Disposing the rear metal layer under the base substrate with the rear metal layer including a metal wire layer configured to connect with a drive chip and a metal light shielding layer configured to block ambient light reduces a spliced bezel of the display panel in application of large size Micro-LED displays, omits depositing and patterning steps of the original metal light shielding layer during manufacturing the thin film transistors and further reduces process steps of manufacturing a TFT drive backplane and lower the manufacturing cost.

Figure 3:
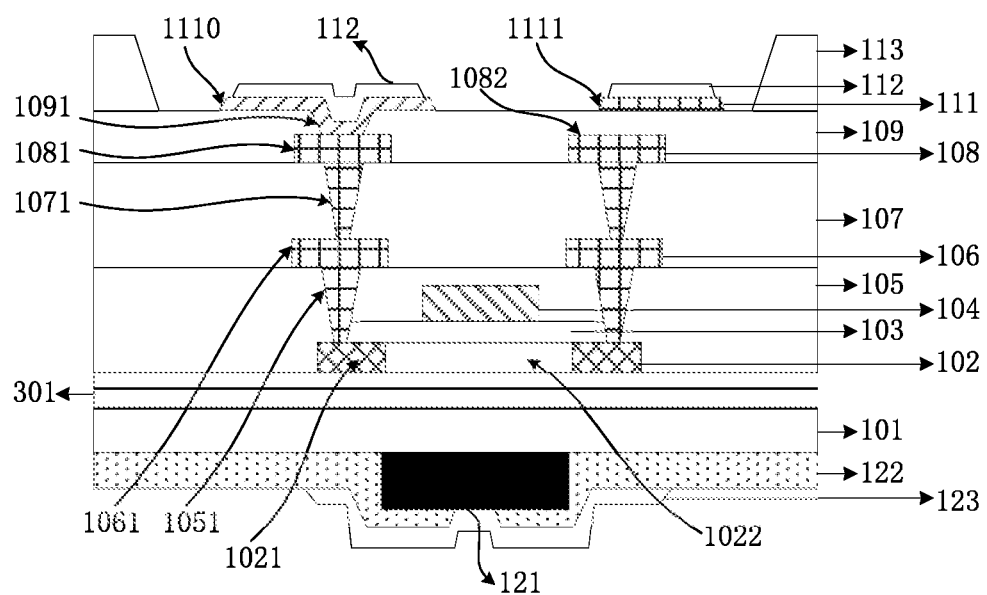
FIG. 3 is a schematic view of laminated structures of a second embodiment of the TFT drive backplane of the present invention.

With reference to FIG. 3, FIG. 3 is a schematic view of laminated structures of a second embodiment of the TFT drive backplane of the present invention. A difference of the second embodiment from the embodiment as shown in FIG. 1 is as follows. In the present embodiment, a buffer layer (Buffer) 301 is disposed between the base substrate 101 and the active layer 102. Specifically, the buffer layer 301 can be a silicon oxide (SiOx) layer or a silicon nitride (SiNx) layer, or can be a composite layer made of stacked silicon oxide layer and silicon nitride layer.

Based on the same invention concept, the present invention also provides a Micro-LED display, the Micro-LED display comprises a TFT drive backplane, the TFT drive backplane employs the above TFT drive backplane of the present invention. The Micro-LED display of the present invention employs a structure of an oxide thin film transistor drive backplane with a high mobility and can achieve satisfaction of the need for large size Micro-LED displays. Disposing the rear metal layer under the base substrate with the rear metal layer including a metal wire layer configured to connect with a drive chip and a metal light shielding layer configured to block ambient light reduces a spliced bezel of the display panel in application of large size Micro-LED displays, omits depositing and patterning steps of the original metal light shielding layer during manufacturing the thin film transistors and further reduce process steps of manufacturing a TFT drive backplane and lower the manufacturing cost.

INDUSTRIAL APPLICABILITY

The subject matter of the present invention can be manufactured and used in industries and therefore has industrial applicability.

What is claimed is:

1. A thin film transistor (TFT) drive backplane, comprising:
    a base substrate;
    an active layer disposed on a first surface of the base substrate, wherein the active layer is made of an oxide semiconductor material with a mobility greater than or equal to 30 cm$^2$/Vs; and
    a rear metal layer entirely disposed under a second surface of the base substrate opposite to the first surface, wherein the rear metal layer comprises a metal light shielding layer, a rear insulation layer, and a metal wire layer, the metal light shielding layer is disposed opposite to the active layer, the rear insulation layer is disposed under the metal light shielding layer and covers the metal light shielding layer, the metal wire layer is disposed under the rear insulation layer, the metal wire layer contacts the metal light shielding layer through a through hole defined through the rear insulation layer, and the through hole overlaps with the active layer along a thickness direction of the base substrate.

2. The TFT drive backplane as claimed in claim 1, wherein the oxide semiconductor material is a first oxide semiconductor material including indium and tin and having a first mobility greater than or equal to 30 cm$^2$/Vs; or the oxide semiconductor material is a second oxide semiconductor material including gallium and tin and having a second mobility greater than or equal to 30 cm$^2$/Vs; or the oxide semiconductor material is a third oxide semiconductor material including indium, fluorine and oxygen and having a third mobility greater than or equal to 30 cm$^2$/Vs.

3. The TFT drive backplane as claimed in claim 1, wherein the active layer is made by a magnetron sputtering process.

4. The TFT drive backplane as claimed in claim 1, further comprising a single source/drain electrode metal layer or a plurality of source/drain electrode metal layers disposed above the base substrate.

5. The TFT drive backplane as claimed in claim 1, wherein the TFT drive backplane further comprises:
    a gate insulation layer and a gate electrode sequentially disposed on the active layer;
    a dielectric insulation layer covering the gate electrode, the gate insulation layer, the active layer, and the base substrate; and
    a first source/drain electrode metal layer and a first passivation layer sequentially disposed on the dielectric insulation layer;
    wherein the active layer comprises a channel region corresponding to the gate electrode and first and second source/drain electrode contact regions located on two sides of the channel region respectively, the first source/drain electrode metal layer comprises a first source/drain electrode, a first through hole is defined through the dielectric insulation layer and over the first source/drain electrode contact region, and the first source/drain electrode contacts the first source/drain electrode contact region through the first through hole.

6. The TFT drive backplane as claimed in claim 5, wherein the TFT drive backplane further comprises:
    a second source/drain electrode metal layer, a second passivation layer, a third source/drain electrode metal layer, and a first transparent conductive layer that are sequentially disposed on the first passivation layer;
    wherein the second source/drain electrode metal layer comprises an electrode connection line and a first drive power line, one of two second through holes is defined through the first passivation layer between the electrode connection line and the first source/drain electrode and the other of the two second through holes is defined through the first passivation layer between the first drive power line and a second source/drain electrode of the first source/drain electrode metal layer, the first source/drain electrode and the second source/drain electrode are connected to the electrode connection line and the first drive power line through the two second through holes respectively; and
    wherein the third source/drain electrode metal layer comprises an anode and a second drive power line, a third through hole is defined through the second passivation layer between the anode and the electrode connection line, and the anode is connected to the electrode connection line through the third through hole.

7. The TFT drive backplane as claimed in claim 5, wherein the TFT drive backplane further comprises: a buffer layer disposed between the active layer and the base substrate.

* * * * *